US008665025B2

(12) United States Patent
Cabrera et al.

(10) Patent No.: US 8,665,025 B2
(45) Date of Patent: Mar. 4, 2014

(54) PUSH-PULL AMPLIFICATION SYSTEMS AND METHODS

(75) Inventors: George Cabrera, Mason, OH (US); Dmitri Borodulin, South Lebanon, OH (US)

(73) Assignee: HBC Solutions, Inc., Englewood, CO (US)

( * ) Notice: Subject to any disclaimer, the term of this patent is extended or adjusted under 35 U.S.C. 154(b) by 49 days.

(21) Appl. No.: 13/544,370

(22) Filed: Jul. 9, 2012

(65) Prior Publication Data

US 2014/0009233 A1    Jan. 9, 2014

(51) Int. Cl.
*H03F 3/26* (2006.01)
(52) U.S. Cl.
USPC .......................................... 330/273; 330/251
(58) Field of Classification Search
USPC ...................... 330/273, 251, 207 A
See application file for complete search history.

(56) References Cited

U.S. PATENT DOCUMENTS

| 5,959,857 | A | | 9/1999 | Nagahara |
| 5,973,556 | A | * | 10/1999 | Su .................................. 330/10 |
| 6,895,227 | B1 | | 5/2005 | Moliere |
| 7,068,096 | B2 | * | 6/2006 | Chu ................................ 330/10 |
| 7,649,413 | B2 | * | 1/2010 | Shiikuma ....................... 330/136 |
| 7,859,336 | B2 | * | 12/2010 | Markowski et al. ........... 330/136 |
| 2006/0012423 | A1 | | 1/2006 | Smith |
| 2010/0259328 | A1 | | 10/2010 | Giovannotto |

OTHER PUBLICATIONS

Int'l Search Report—3 pgs., Apr. 19, 2013, Harris Corporation.
Written Opinion of the Int'l Searching Authority—5 pgs., Apr. 19, 2013, Harris Corporation.

* cited by examiner

*Primary Examiner* — Henry Choe
(74) *Attorney, Agent, or Firm* — Tarolli, Sundheim, Covell & Tummino LLP (57) ABSTRACT

An amplification system is provided that comprises a push-pull amplifier system having a first power transistor series coupled with a second power transistor that alternately switch between a push-pull amplifier mode of operation and a single-ended amplifier mode of operation. In the push-pull amplifier mode, both the first power transistor and the second power transistor alternately conduct to provide an amplified output signal to an output load in response to an input signal having an amplitude that is greater than or equal to a threshold level. In the single-ended amplifier mode of operation, the first power transistor conducts and the second power transistor is disabled for amplification purposes in response to the input signal having an amplitude that is less than the threshold level.

25 Claims, 8 Drawing Sheets

PUSH-PULL AMPLIFICATION SYSTEMS AND METHODS

TECHNICAL FIELD

The present invention relates generally to communication, and specifically to push-pull amplification systems and methods.

BACKGROUND

An electronic amplifier is a device for increasing the power of a signal. Generally, an amplifier outputs energy from a provided power supply and controls the output to match an associated shape of an input signal with a larger amplitude. There are many types of electronic amplifiers, and they are commonly used in radio and television transmitters and receivers, high-fidelity stereo equipment, microcomputers and other electronic digital equipment, and audio amplifiers. Digital waveforms commonly used in high-definition (HD) television and radio broadcast and wireless carriers employ deep amplitude modulations of the RF signal. The RF signal will go from very low levels (and very low efficiency) to very high levels (and high efficiency). Over the last century, several techniques have been devised with the purpose to maintain high efficiency at lower levels of the RF signal. For the most parts these techniques fall into one of three categories; impedance modulation, drain modulation, and switched mode amplification.

SUMMARY

In one embodiment, an amplification system is provided that comprises a push-pull amplifier system having a first power transistor series coupled with a second power transistor that alternately switch between a push-pull amplifier mode of operation and a single-ended amplifier mode of operation. In the push-pull amplifier mode, both the first power transistor and the second power transistor alternately conduct to provide an amplified output signal to an output load in response to an input signal having an amplitude that is greater than or equal to a threshold level. In the single-ended amplifier mode of operation, the first power transistor conducts and the second power transistor is disabled for amplification purposes in response to the input signal having an amplitude that is less than the threshold level.

In another embodiment, an amplification system is provided that comprises a first power transistor series coupled with a second power transistor wherein the first power transistor receives a first input signal at its gate that is ½ of the voltage of an input signal received from a first end of a secondary winding of an input transformer and the second power transistor receives a second input signal that is ½ of the voltage of the input signal and 180° out of phase with the first input signal received from a second end of the secondary winding of the input transformer. The amplification system has a first state with the first and second power transistors alternately switching between providing a return path and pulling current from a DC power supply to provide an amplified output signal to an output load in response to the first and second input signals during a push-pull amplifier mode of operation. Additionally, the amplification system has a second state that employs the first power transistor in single-ended amplifier mode of operation in response to the first input signal and disables the second power transistor for amplification purposes. The first power transistor drives double the output impedance in the single-ended amplifier mode than the output impedance it drives in the push-pull amplifier mode.

In yet another embodiment, a method of amplifying an input signal with increased efficiency employing a push-pull amplifier having a pair of series coupled power transistors is provided. The method comprises comparing envelope amplitude levels of an input signal to an envelope amplitude threshold, amplifying the input signal in a push-pull amplifier mode employing both of the series coupled power transistors for envelope amplitude levels of the input signal that fall at or above the envelope amplitude threshold, and amplifying the input signal in a single-ended amplifier mode employing one of the series coupled power transistors and disabling the other of the series coupled power transistors for amplification purposes for envelope amplitude levels of the input signal that fall below the envelope amplitude threshold.

DETAILED DESCRIPTION

The present invention relates to amplification system and methods. In one embodiment, an amplification system is provided that switches between operation of a push-pull amplifier system amplifying in a push-pull amplifier mode and between amplifying in a single-ended amplifier mode based on a characteristic (e.g., envelope amplitude level) of an input signal relative to a transition point or threshold level (e.g., envelope amplitude level, amplifier power level). In the push-pull amplifier mode, the push-pull amplifier system amplifies the input signal by employing a pair of series coupled power transistors. In the single-ended amplifier mode, the push-pull amplifier system amplifies the input signal by employing only one of the pair of series coupled power transistors while disabling the other of the pair of series coupled power transistors for amplification purposes. The present invention can be employed to increase the efficiency of a radio frequency (RF) power amplifier, over a wide frequency range (wide bandwidth).

Figure 1:
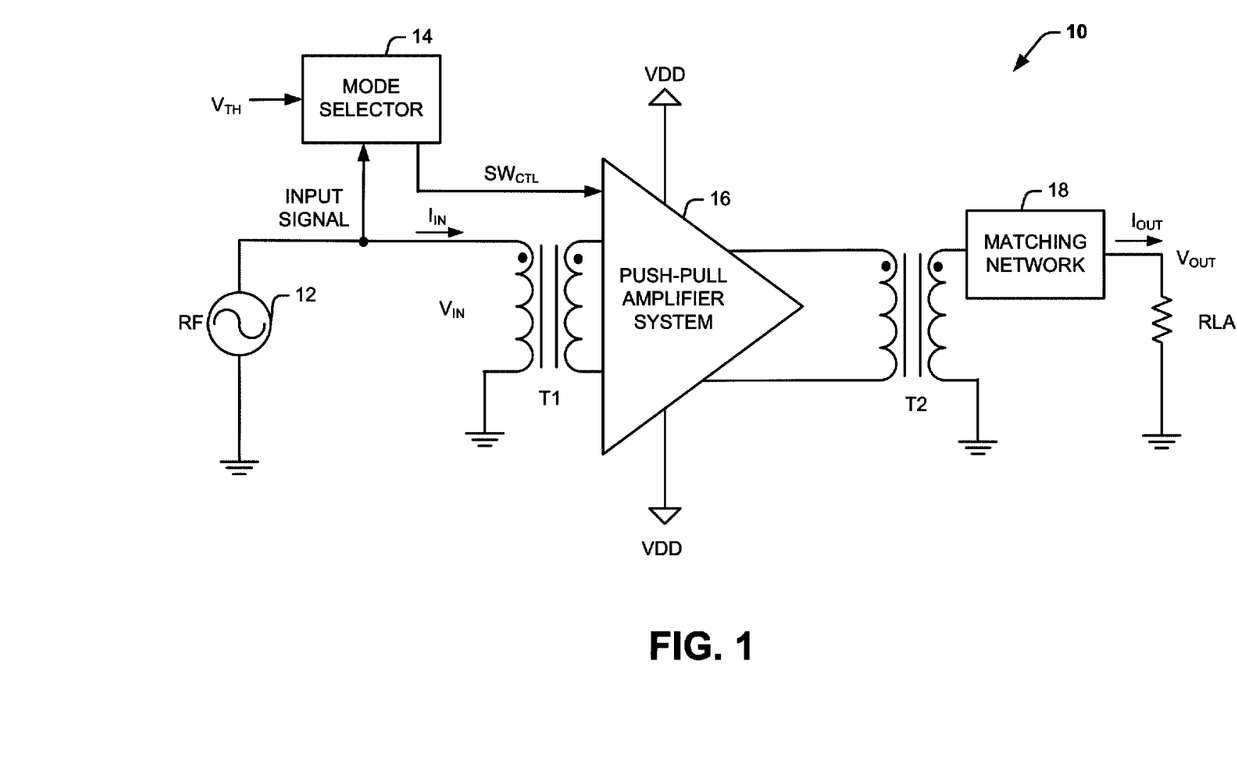
FIG. 1 illustrates an amplification system in accordance with an aspect of the present invention.

FIG. 1 illustrates an amplification system 10 in accordance with an aspect of the present invention. The amplification system 10 switches between operation of a push-pull amplifier system 16 amplifying in a push-pull amplifier mode and between amplifying in a single-ended amplifier mode based on a characteristic (e.g., envelope amplitude level) of an input signal relative to a transition point or threshold level. For example, the threshold level can be a selected envelope amplitude level or digital count corresponding to the envelope amplitude of the input signal. The amplification system 10 can then operate in a push-pull amplifier mode for envelope amplitude levels between envelope peak voltages and the threshold level(s), and in a single-ended amplifier mode for envelope amplitude levels at or below the threshold level(s). The threshold levels can be selected at both a positive and negative voltage levels to create an envelope amplitude threshold window, such that envelope amplitude levels that fall within the envelope amplitude threshold window cause the amplification system 10 to operate in a single-ended amplifier mode and envelope amplitude levels that fall outside of the envelope amplitude threshold window cause the amplification system 10 to operate in a push-pull amplifier mode.

Although the present examples will be illustrated as the threshold levels being envelope amplitude levels, it is to be appreciated that the threshold level of the amplification system 10 can be based on one or more characteristics associated with the input signal based on a desired efficiency, linearity, distortion and acceptable out-of-band (OOB) emissions of the amplification system 10.

In the present example, the input signal is an analog signal provided by a radio frequency source 12. However, the input signal could be a digital signal that is provided to a digital-to-analog converter to provide an analog signal. The input signal provides an input current $I_{IN}$ to produce an input voltage $V_{IN}$ across the primary windings of an input transformer T1. The input current and voltage is transformed to a secondary winding of the input transformer T1 and split to provide ½ of its output voltage to be provided as a first input signal to a first power transistor Q1 (illustrated in FIG. 3) of a pair of series coupled power transistors of the push-pull amplifier system 16, and a second input signal that is 180° out of phase with the first input signal to be provided to a second power transistor Q2 of the pair of series coupled power transistors of the push-pull amplifier system 16.

A mode selector 14 receives the input signal and continuously (e.g., in real-time) switches the push-pull amplifier system 16 between a push-pull amplifier mode and a single-ended amplifier mode employing one or more switch control signals ($SW_{CTL}$) based on changes in one or more characteristics of an input signal relative to one or more thresholds that define an envelope amplitude threshold window. The mode selector 14 receives the input signal that is typically a phase and/or amplitude modulated signal. The input signal can be in a variety of different amplitude and/or phase modulated forms.

For example, the input signal can be a signal that conforms to WCDMA, multi-carrier GSM, OFDM or other signals having high peak-to-average power ratios (PAR). The mode selector 14 can be an analog and/or a digital component, such as a programmable logic device, application specific integrated circuit (ASIC), a digital signal processor (DSP) or a combination of digital hardware and/or software components. The mode selector 14 also receives one or more threshold levels ($V_{TH}$) that can be one or more fixed, selectable or programmable characteristics (e.g., envelope amplitude level) associated with the input signal. Although, the mode selector 14 is illustrated as receiving one or more threshold levels, it is to be appreciated that the one or more threshold levels employed by the mode selector 14 can be preprogrammed or programmable, or based on knowledge associated with changes in characteristics associated with the input signal. Additionally, the one or more threshold levels can be fixed or variable.

For example, during high envelope levels that are at or above a positive and negative threshold voltage and outside an envelope amplitude threshold window, the mode selector 14 will select the push-pull amplifier mode and both series coupled power transistors will alternate between conducting and not conducting to provide an amplified version of the input signal to a primary winding of an output transformer T2. A transformed amplified version of input signal will be output at the secondary winding of the transformer T2 and provide output current $I_{OUT}$ and output voltage $V_{OUT}$ through a matching network 18 to a system output load RLA (e.g., 50 ohms). Furthermore, during low envelope levels that are below a positive and negative threshold voltage and within the envelope amplitude threshold window, the mode selector 14 will select the single-ended amplifier mode and one of the series coupled power transistors will alternate between conducting and not conducting to provide a portion of the amplified version of the input signal to a primary winding of an output transformer L2.

It is to be appreciated that since each of the transistors only conducts in either a positive portion of the input signal or a negative portion of the input signal and not both, one of the positive or negative portions of the amplified output signal will not be provided as part of the output signal. A transformed portion of amplified version of input signal will be output at the secondary winding of the output transformer T2 to the matching network 18. The matching network 18 will restore the missing portion of the transformed amplified version of the input signal and provide output current $I_{OUT}$ and output voltage $V_{OUT}$ to the system output load RLA.

Figure 2:
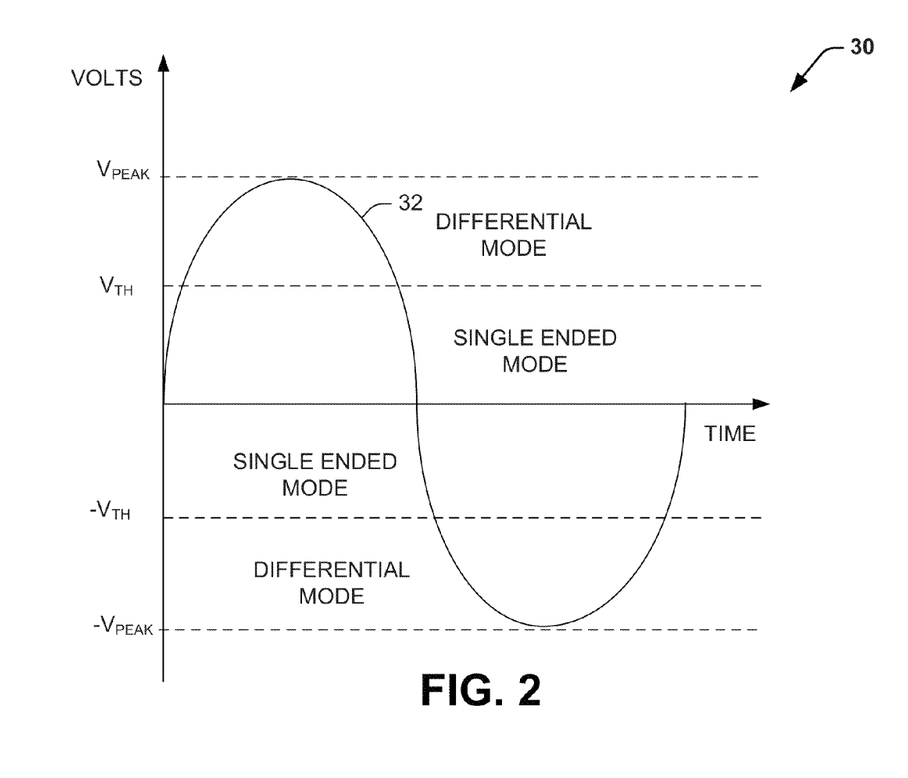
FIG. 2 illustrates a graph of voltage amplitude versus time of a portion of exemplary input signal waveform in accordance with an aspect of the present invention.

FIG. 2 illustrates a graph 30 of voltage amplitude versus time of a portion of exemplary input signal waveform 32 in accordance with an aspect of the present invention. The exemplary input signal waveform 32 is generally sinusoidal in shape alternating between positive and negative amplitude voltages. However, the input signal waveform 32 can be of different shapes that alternate between positive and negative amplitude voltages. A single period of the input signal waveform 32 is shown for illustrative purposes. The input signal waveform 32 can be the input signal to the primary of the transformer T1 illustrated in FIG. 1.

During the first rising positive portion of the input signal waveform 32, the amplification system 10 operates in single-ended amplifier mode since the envelope amplitude level rises from zero and is at or below a positive threshold voltage ($V_{TH}$) and within an envelope amplitude threshold window that extend from the positive threshold voltage ($V_{TH}$) to a negative threshold voltage ($-V_{TH}$). The amplification system 10 switches into operating in a push-pull amplifier mode upon the envelope amplitude level of the input signal waveform 32 exceeding the positive threshold voltage ($V_{TH}$). The envelope amplitude level then rises to its peak voltage ($V_{PEAK}$) and falls back down switching back to the single-ended amplifier mode when it passes the positive threshold voltage ($V_{TH}$) until it falls below the negative threshold voltage ($-V_{TH}$) switching back to the push-pull amplifier mode. The envelope amplitude level continues falling to its negative peak voltage ($-V_{PEAK}$) and rises up again switching back to the single-ended amplifier mode when it passes the negative threshold voltage ($-V_{TH}$) and returning to zero. As previously stated, since each of the transistors only conducts in either a positive portion of the input signal or a negative portion of the input signal and not both, one of the positive or negative portions of the amplified output signal will not be provided as part of the output signal.

It is to be appreciated that during the push-pull amplifier mode, each series coupled power transistor will see an output impedance of RLA which is the optimum impedance to achieving maximum power and maximum efficiency. However, during the single-ended amplifier mode, the selected conducting transistor will see an output impedance of 2*RLA or twice the optimum impedance to a single transistor device. This doubling in working impedance for a single transistor device will make it operate at higher efficiency until the point at which the transistor device saturates as will be explained further below. Therefore, the amplification system 10 employs a form of impedance modulation.

The impedance modulation can be accomplished by employing intrinsic, extrinsic, or synchronous extrinsic switching. A device will be considered intrinsic to the push-pull operation if it is used in the push-pull (differential) operation of the amplifier, and is then repurposed as a switch when reconfiguring the amplifier to a single-ended amplifier mode operation. Extrinsic is any other device used as a switch when reconfiguring the output network, even if it is a device that were to reside inside the same package as the intrinsic devices, but is not used in the push-pull operation of the amplifier.

It is to be appreciated that switching between the two power transistors and the intrinsic and extrinsic switching can be either accomplished through fast switching of soft switching. Soft switching can mitigate problems of fast switching by slowing turning the power transistors and switches on and off during mode transitioning.

Figure 3:
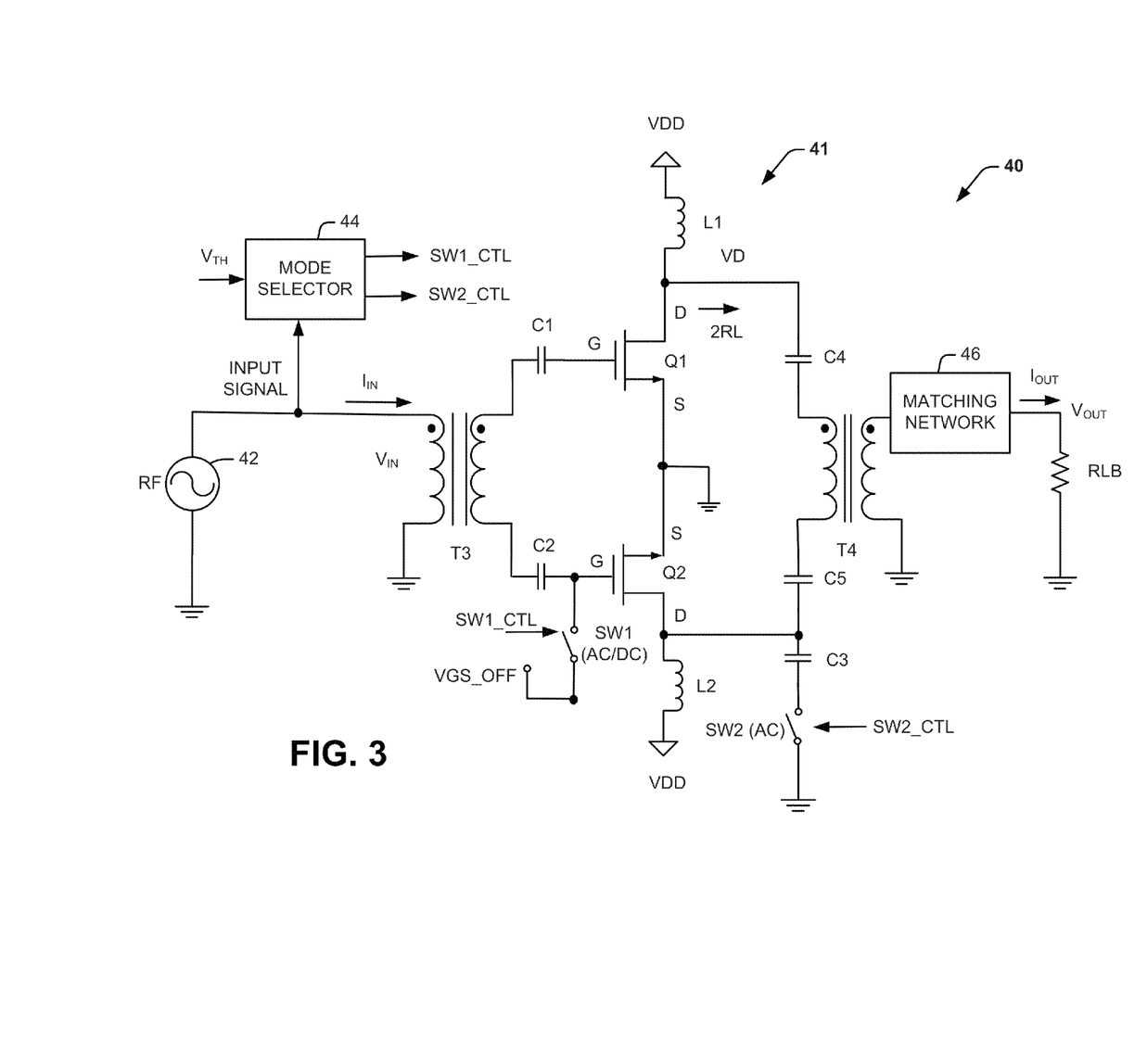
FIG. 3 illustrates an amplification system that employs impedance modulation utilizing extrinsic switching in accordance with an aspect of the present invention.

FIG. 3 illustrates an amplification system 40 that employs impedance modulation utilizing extrinsic switching in accordance with an aspect of the present invention. The amplification system 40 switches between operation of a push-pull amplifier system 41 amplifying in a push-pull amplifier mode and between amplifying in a single-ended amplifier mode based on a characteristic of an input signal relative to a transition point or threshold level. An input signal is provided by a radio frequency source 42, which provides an input current $I_{IN}$ to produce an input voltage $V_{IN}$ across the primary windings of an input transformer T3. The input current and voltage is transformed to a secondary winding of the input transformer T3 and split to provide ½ of its output voltage to be provided as a first input signal to a gate of a first power transistor Q1 through capacitor C1 and a second input signal that is 180° out of phase with the first input signal to be provided to a gate of a second power transistor Q2 through a capacitor C2.

A mode selector 44 receives the input signal and continuously (e.g., in real-time) switches the push-pull power amplifier system 41 between amplifying in a push-pull amplifier mode and amplifying in a single-ended amplifier mode employing a first switch control signal (SW1_CTL) that opens and closes a first switch SW1 and a second switch control signal (SW2_CTL) that opens and closes a second switch SW2. The switching is based on changes in one or more characteristics of an input signal relative to one or more thresholds ($V_{TH}$) that define an envelope amplitude threshold window. The push pull amplifier system 41 includes a first inductor L1 that couples a drain of the first power transistor Q1 to a power supply VDD and a second inductor L2 that couples a drain of the second power transistor Q2 to the power supply VDD. The drain of the first power transistor Q1 is also coupled to a positive terminal of the primary of an output transformer T4 through a capacitor C4 and the drain of the second power transistor Q2 is also coupled to a negative terminal of the primary of the output transformer T4 through a capacitor C5. The secondary winding of the output transformer T4 is coupled to a system output load RLB through a matching network 46.

The first switch SW1 is a DC switch that is coupled to a gate of the second power transistor Q2 The second end of the first switch SW1 is also coupled to a gate-to-source off voltage (VGS_OFF) (e.g., −5 volts). The second switch SW2 is an AC switch and is coupled to ground on a first end and a capacitor C3 on a second end. The other end of the capacitor C3 is coupled to the drain of the second power transistor Q2 and an end of capacitor C5 opposite the end coupled to the primary winding of the output transformer T4.

For example, during high envelope levels (e.g., $V_{out}$ > $V_{out\_sat/2}$) that are at or above a positive and negative threshold voltage and outside the envelope amplitude threshold window, the mode selector 44 will select the push-pull amplifier mode, which will open both the first switch SW1 and the second switch SW2. This will allow for both series coupled power transistors Q1 and Q2 to conduct in push-pull mode to provide an amplified version of the input signal to a primary winding of an output transformer T2. A transformed amplified version of input signal will be output at the secondary winding of the transformer T2 and provide output current $I_{OUT}$ and output voltage $V_{OUT}$ through a matching network 46 to the system output load RLB (e.g., 50 ohms).

Furthermore, during low envelope levels (at $V_{out}$ ≤ $V_{out\_sat/2}$) that are below a positive and negative threshold voltage and within the envelope amplitude threshold window, the mode selector 44 will select the single-ended amplifier mode. This will cause the first switch SW1 to close biasing the first power transistor negatively by applying VGS_OFF (e.g., −5 volts) to the gate of the second power transistor Q2 At or about the same time, the second switch SW2 will close AC shorting the drain of the second power transistor Q2 and providing a ground path for return current of the push-pull amplifier system 41. The closing of the first switch SW1 and the second switch SW2 will disable the second power transistor Q2 for amplification purposes and the first power transistor Q1 will alternate between conducting and not conducting to provide a portion of the amplified version of the input signal to a primary winding of the output transformer T4. A transformed portion of amplified version of the input signal will be output at the secondary winding of the output transformer T2 to the matching network 46. The matching network 46 will restore the missing portion of the transformed amplified version of the input signal and provide output current $I_{OUT}$ and output voltage $V_{OUT}$ to the system output load RLB.

It is to be appreciated that when the push-pull amplifier system 41 is configured in single-ended amplifier mode, the optimum impedance of the first power transistor Q1 will see twice the output load 2*RLOAD. Therefore, the second switch SW2 can be a transistor that is ½ the size of the first and second power transistors Q1 and Q2 since it only needs to sink ½ of the current. Furthermore, the doubling in working impedance for Q1 will make it operate at higher efficiency up $V_{out\_sat/2}$, at which point the device saturates. As the envelope crosses, for example, the half-way point, switches SW1 and SW2 can then be disengaged (opened) and the push-pull amplifier system 41 can be reconfigured again to a full push-pull topology, extending its operating range out to $V_{out\_sat}$. To guarantee the impedance is effectively doubled when the circuit is reconfigured from push-pull amplifier mode to single-ended amplifier mode, the differential circuit formed by the output transformer T4 and matching network 46 needs to have a very high even mode impedance. It is also to be appreciated that the use of SW1 is optional, as its function can be replaced/eliminated by biasing Q2 into class C. In this bias condition, Q2 will turn itself off at any input voltage below threshold, and will turn itself on at any voltage at or above the threshold voltage. This point of cut-off will then be matched with the actuation of SW2.

Figure 4:
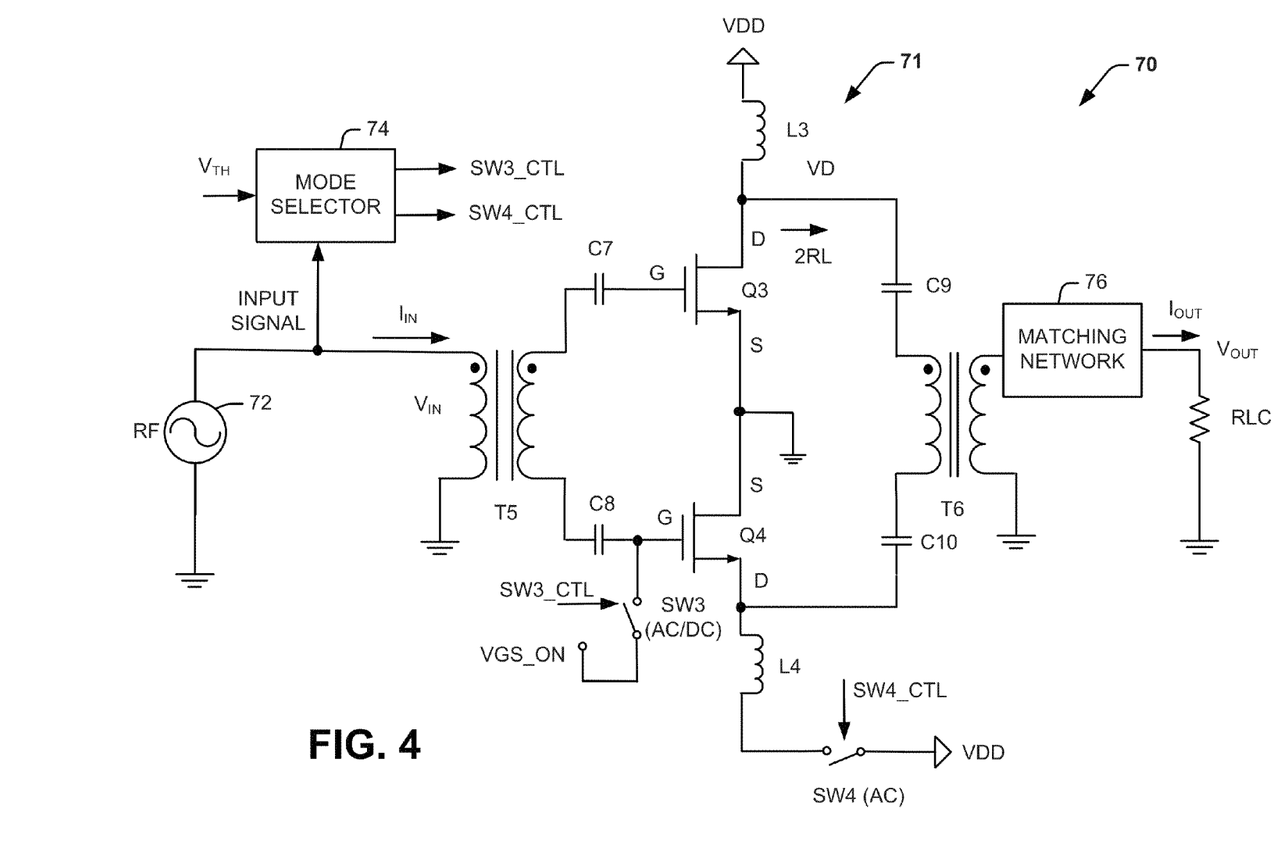
FIG. 4 illustrates an amplification system that employs impedance modulation utilizing intrinsic switching in accordance with an aspect of the present invention.

FIG. 4 illustrates an amplification system 70 that employs impedance modulation utilizing intrinsic switching in accordance with an aspect of the present invention. The amplification system 70 switches between operation of a push-pull amplifier system 71 amplifying in a push-pull amplifier mode and between amplifying in a single-ended amplifier mode based on a characteristic of an input signal relative to a transition point or threshold level. An input signal is provided by a radio frequency source 72, which provides an input current $I_{IN}$ to produce an input voltage $V_{IN}$ across the primary windings of an input transformer T5. The input current and voltage is transformed to a secondary winding of the input transformer T5 and split to provide ½ of its output voltage to be provided as a first input signal to a gate of a first power transistor Q3 through capacitor C7 and a second input signal that is 180° out of phase with the first input signal to be provided to a gate of a second power transistor Q4 through a capacitor C8.

A mode selector 74 receives the input signal and continuously (e.g., in real-time) switches the push-pull power amplifier system 71 between amplifying in a push-pull amplifier mode and amplifying in a single-ended amplifier mode employing a first switch control signal (SW3_CTL) that opens and closes a first switch SW3 and a second switch control signal (SW4_CTL) that opens and closes a second switch SW4. The switching is based on changes in one or more characteristics of an input signal relative to one or more thresholds ($V_{TH}$) that define an envelope amplitude threshold window. The push pull amplifier system 71 includes a first inductor L3 that couples a drain of the first power transistor Q3 to a DC power supply VDD and a second inductor L4 that couples a drain of the second power transistor Q4 to the DC power supply VDD. The drain of the first power transistor Q3 is also coupled to a positive terminal of the primary of the output transformer T6 through a capacitor C9 and the drain of the second power transistor Q4 is also coupled to a negative terminal of the primary of the output transformer through a capacitor C10. The secondary winding of the output transformer T6 is coupled to a system output load RLC through a matching network 76.

The first switch SW3 is a DC switch that is coupled to a gate of the second power transistor Q4 The second end of the first switch SW3 is also coupled to a gate-to-source on voltage (VGS_ON). The second switch SW4 is an DC switch and is coupled to Vdd (Drain Supply Voltage) on a first end and the second inductor L4 on a second end. For example, during high envelope levels (e.g., $V_{out} > V_{out\_sat/2}$) that are at or above a positive and negative threshold voltage and outside the envelope amplitude threshold window, the mode selector 74 will select the push-pull amplifier mode, which will open the first switch SW3 and close the second switch SW4. This will allow for both series coupled power transistors Q3 and Q4 to conduct in push-pull mode to provide an amplified version of the input signal to a primary winding of the output transformer T6. A transformed amplified version of input signal will be output at the secondary winding of the transformer T2 and provide output current $I_{OUT}$ and output voltage $V_{OUT}$ through a matching network 76 to the system output load RLC (e.g., 50 ohms).

Furthermore, during low envelope levels (at $V_{out} \leq V_{out\_sat/2}$) that are at or below a positive and negative threshold voltage and within an envelope amplitude threshold window, the mode selector 74 will select the single-ended amplifier mode. This will cause the second switch SW4 to open removing power from the second inductor L4 followed by closing of the first switch SW3 biasing the second power transistor Q4 positively by applying VGS_ON (e.g., +5 volts) to the gate of the second power transistor. The opening of the second switch SW4 provides for a return current path through the second power transistor Q4 to ground. The closing of the first switch SW3 will lock the second power transistor Q4 to an ON state. The first power transistor Q3 will alternate between conducting and not conducting to provide a portion of the amplified version of the input signal to a primary winding of the output transformer T6. A transformed portion of amplified version of input signal will be output at the secondary winding of the output transformer T6 to the matching network 76. The matching network 76 will restore the missing portion of the transformed amplified version of the input signal and provide output current $I_{OUT}$ and output voltage $V_{OUT}$ to the system output load RLC.

The proper sequence should be observed when locking on Q4 (configuring the intrinsic Q4 into an AC switch) to avoid shorting the power supply to ground through the second power transistor Q4 thus destroying the second power transistor Q4. That is the second switch SW4 is opened, disabling the power supply VDD from the second power transistor Q4, and then closing the first switch SW3, biasing up the gate of the second power transistor Q4 to full conduction, and creating an AC ground in that node. At high envelope levels (at $V_{out} > V_{out\_sat/2}$), both the first power transistor and the second power transistor will conduct again in push-pull mode. As the envelope crosses on its way up this half-way point, the first switch SW3 is opened and the second switch SW4 is then closed and the push-pull amplifier system is reconfigured again to a full push-pull topology, extending its operating range out to $V_{out\_sat}$.

Figure 5:
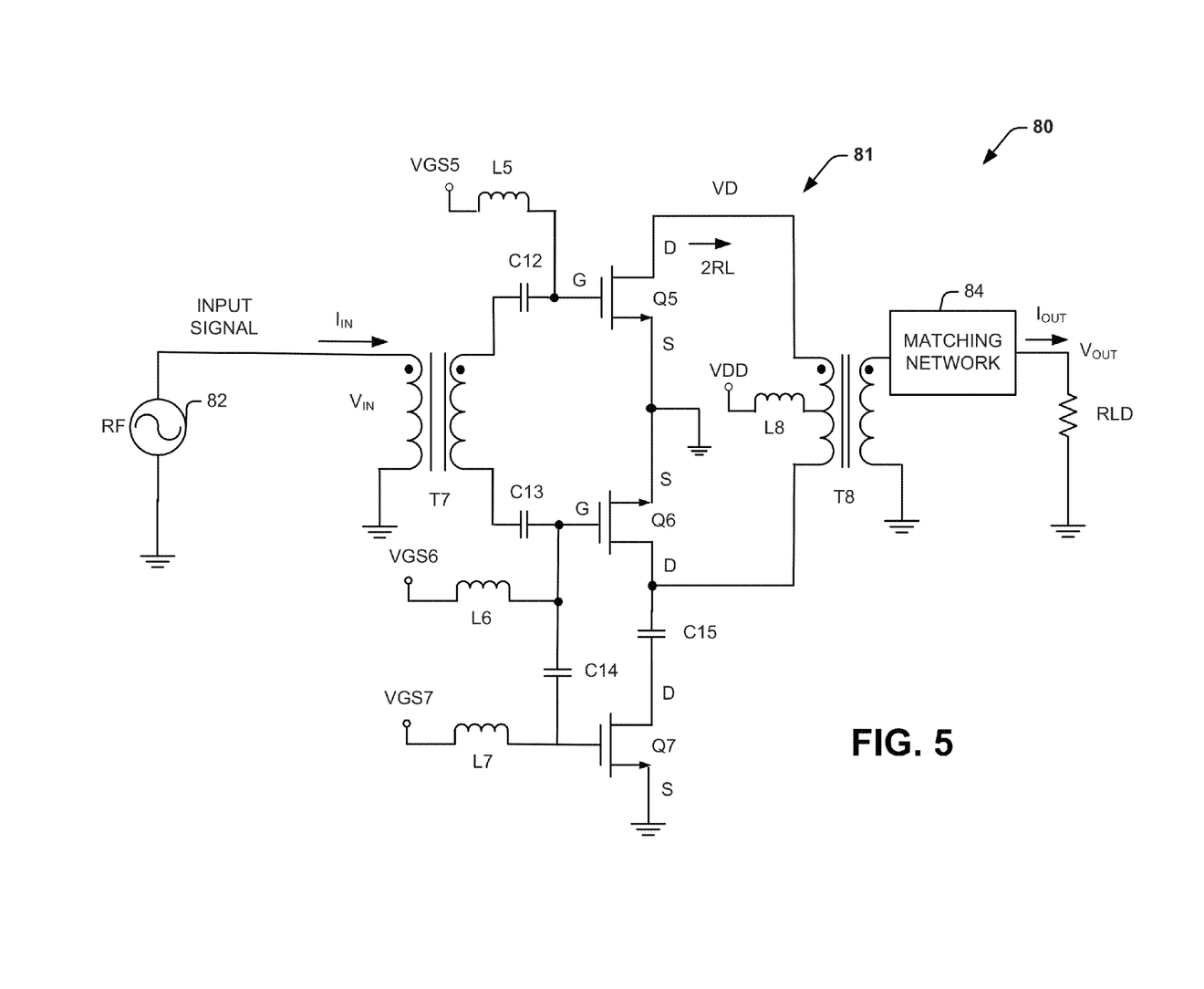
FIG. 5 illustrates an amplification system that employs impedance modulation utilizing synchronous extrinsic AC switching in accordance with an aspect of the present invention.

FIG. 5 illustrates an amplification system 80 that employs impedance modulation utilizing synchronous extrinsic switching in accordance with an aspect of the present invention. The amplification system 80 of FIG. 5 does not employ a mode selector, since the amplification system is configured to switch between modes in synchronism with an RF input signal. The amplification system 80 switches between operation of a push-pull amplifier system 81 amplifying in a push-pull amplifier mode and between amplifying in a single-ended amplifier mode based on a characteristic of an input signal relative to a transition point or threshold level. An input signal is provided by a radio frequency source 82, which provides an input current $I_{IN}$ to produce an input voltage $V_{IN}$ across the primary windings of an input transformer T7. The input current and voltage is transformed to a secondary winding of the input transformer T7 and split to provide ½ of its output voltage to be provided as a first input signal to a gate of a first power transistor Q5 through capacitor C12 and a second input signal that is 180° out of phase with the first input signal to be provided to a gate of a second power transistor Q6 through a capacitor C13.

The drain of the first power transistor Q5 is coupled to a positive terminal of the primary of an output transformer T8 and the drain of the second power transistor Q6 is also coupled to a negative terminal of the primary of the output transformer T8. The drain of the second power transistor Q6 is also coupled to a drain of a third transistor Q7 through a capacitor C15, which is coupled to ground at a source of the third transistor Q7. The primary winding of the output transformer T8 is coupled to a power supply VDD through an inductor L8 at a center tap of the output transformer T8. The secondary winding of the output transformer T8 is coupled to a system output load RLD through a matching network 84.

A first bias signal VGS5 biases the first power transistor Q5 through an inductor L5. The first bias signal VGS5 can be selected to bias the first power transistor Q5 in a class AB linear mode (e.g., above the threshold voltage into conduction of the first power transistor Q5 (about 2.6 volts DC)). A second bias signal VGS6 biases the second power transistor Q6 through an inductor L6. The second bias signal VGS6 can be selected to bias the second power transistor Q6 in a class C mode (e.g., below the threshold voltage of conduction of the second power transistor Q5 (about 1.5 volts DC)). A third bias signal VGS7 biases a third transistor Q7 through an inductor L7. The third bias signal VGS7 can be selected to bias the third transistor Q7 in a class AB mode (e.g., slightly above the threshold voltage into conduction of the third transistor Q7 (about 2.3 volts DC)). Alternatively, the third bias signal VGS7 can be selected to bias the third transistor Q7 in class AB mode at low envelope levels (e.g., $v_{out} < v_{out\_sat/2}$) and be biased to turn the third transistor Q7 off at high envelope levels (e.g., $v_{out} \geq v_{out\_sat/2}$) to reduce power losses by Q7 being on at all times. A capacitor C14 separates the gates of the second power transistor Q6 and the third transistor Q7 in addition to the inductors L6 and L7.

The second bias signal VGS6 provides a DC offset to the AC input signal provided to the second power transistor Q6. The second power transistor Q6 and the third transistor Q7 form a parallel arrangement of transistors that receive the second input signal. The second power transistor begins conducting when the AC input signal passes a threshold (VTH) and stops conducting when the AC input signal falls below the threshold voltage (VTH). The third power transistor Q7 provides a path to sink current from the first power transistor Q5 at envelope levels below the threshold voltage (VTH). Therefore, the push-pull amplifier system 81 switches between amplifying in a push-pull amplifier mode and amplifying in a single-ended amplifier mode in response to the amplitude of the AC input signal without the need for employing a mode selector.

For example, during high envelope levels (e.g., $V_{out} > V_{out\_sat/2}$) that are at or above a positive threshold voltage the push-pull amplifier system will operate in the push-pull amplifier mode, such that both series coupled power transistors Q5 and Q6 conduct in push-pull mode to provide an amplified version of the input signal to the primary winding of the output transformer T8. A transformed amplified version of input signal will be output at the secondary winding of the transformer T8 and provide output current $I_{OUT}$ and output voltage $V_{OUT}$ through a matching network 84 to the system output load RLD (e.g., 50 ohms).

Furthermore, during low envelope levels (at $V_{out} \leq V_{out\_sat/2}$) that are below a positive threshold voltage (VTH), the push-pull amplifier system 81 will operate in the single-ended amplifier mode. That is the first power transistor Q5 will conduct, the second power transistor Q6 will be off and not conduct and the third transistor Q7 will conduct and provide a path for discharging current. A transformed portion of amplified version of the input signal will be output at the secondary winding of the output transformer T8 to the matching network 84. The matching network 84 will restore the missing portion of the transformed amplified version of the input signal and provide output current $I_{OUT}$ and output voltage $V_{OUT}$ to the system output load RLD.

Figure 6:
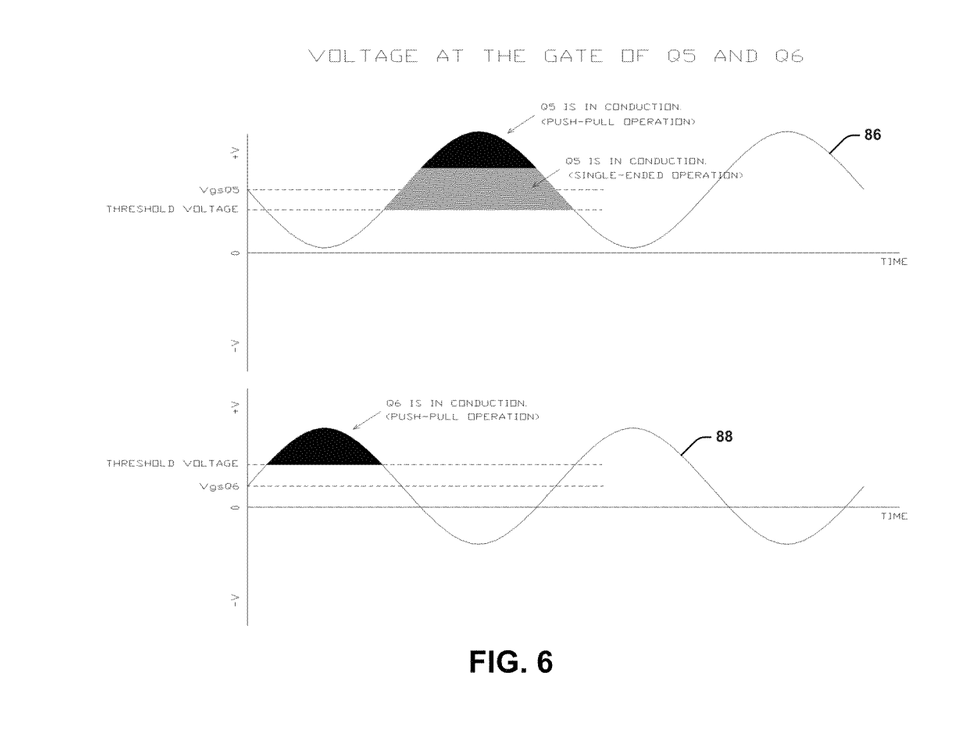
FIG. 6 illustrates a graph of voltage amplitude versus time of a portion of exemplary first and second input signal waveforms for the amplification system of FIG. 5 in accordance with an aspect of the present invention.

FIG. 6 illustrates example voltage versus time graphs of a first input signal 86 to the gate of Q5 and a second input signal 88 to the gate of Q6. As illustrated in the graph of the first input signal 86, the first power transistor Q5 begins conducting in the single-ended amplification mode (black portion of first input signal 86) once the voltage rises above a predetermined threshold voltage that is below the bias voltage VGS5 to the first power transistor Q5. This is approximately the same time that the second power transistor Q6 stops conducting in the push-pull amplification mode as illustrated in the graph of the second input signal 88. The graph of the first input signal 86 further illustrates that at a given amplitude level of the first input signal 86, the first power transistor Q5 begins operating in the push-pull mode (grey portion of the first input signal 86) approximately at the same time that the second input signal 88 crosses zero volts. As illustrated in the graph of the second input signal 88, the second power transistor Q6 begins conducting in the push-pull amplification mode (grey portion of second input signal 88) once the voltage rises above the predetermined threshold voltage that is above the bias voltage VGS6 to Q6 and stops conducting one the voltage falls below the predetermined threshold voltage.

Figure 7:
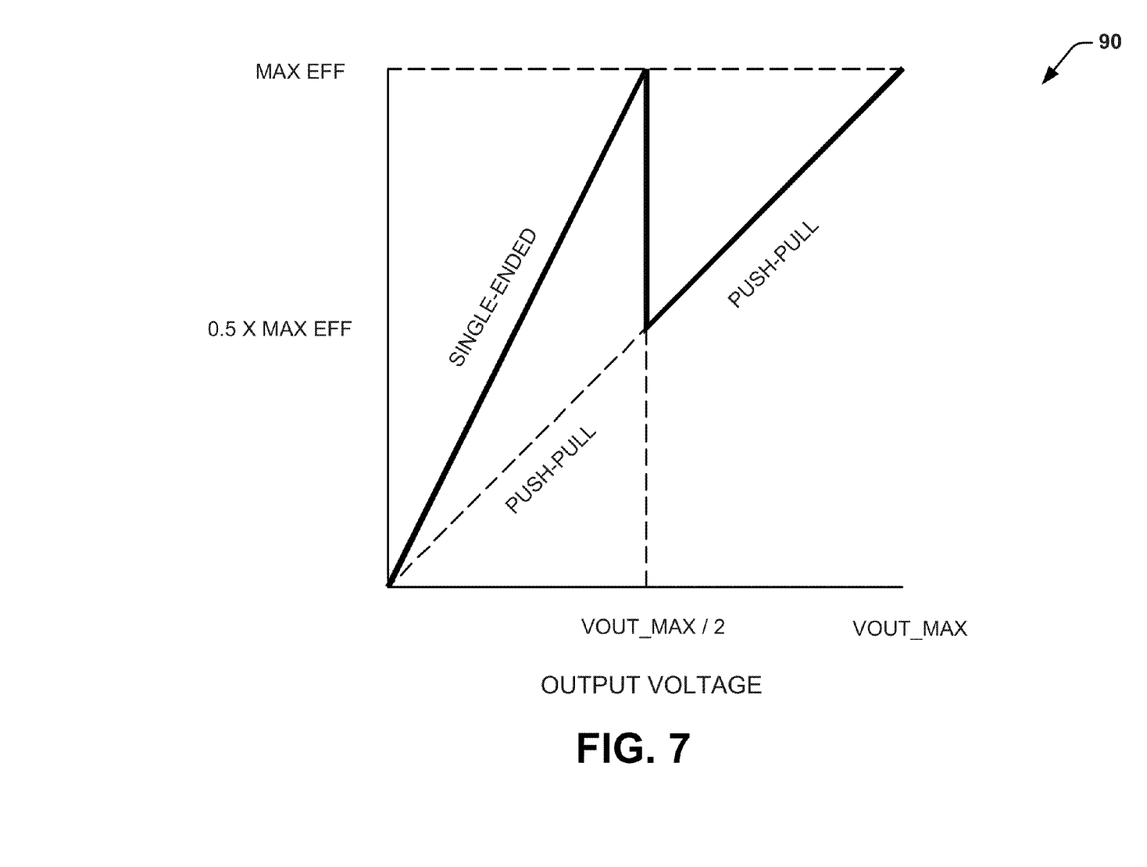
FIG. 7 illustrates a graph of output voltage versus efficiency for the amplification systems illustrated in FIGS. 3-5.

FIG. 7 illustrates a graph 90 of output voltage versus efficiency for the amplification systems illustrated in FIGS. 3-5. The graph 90 illustrates the increase of efficiency of the amplification system operating in single-ended amplifier mode from 0 volts to VOUT_MAX/2 as opposed to operating in the push-pull mode from 0 volts to VOUT_MAX/2. As illustrated in the graph 90, the amplification systems only achieve ½ of the maximum efficiency at VOUT_MAX/2 when operating in the push-pull mode from 0 volts to VOUT_MAX/2, while the amplification systems achieve maximum efficiency when operating in the single-ended amplifier mode from 0 volts to VOUT_MAX/2 and ramps up much more quickly than the amplification systems operating in the push-pull mode from 0 volts to VOUT_MAX/2.

Figure 8:
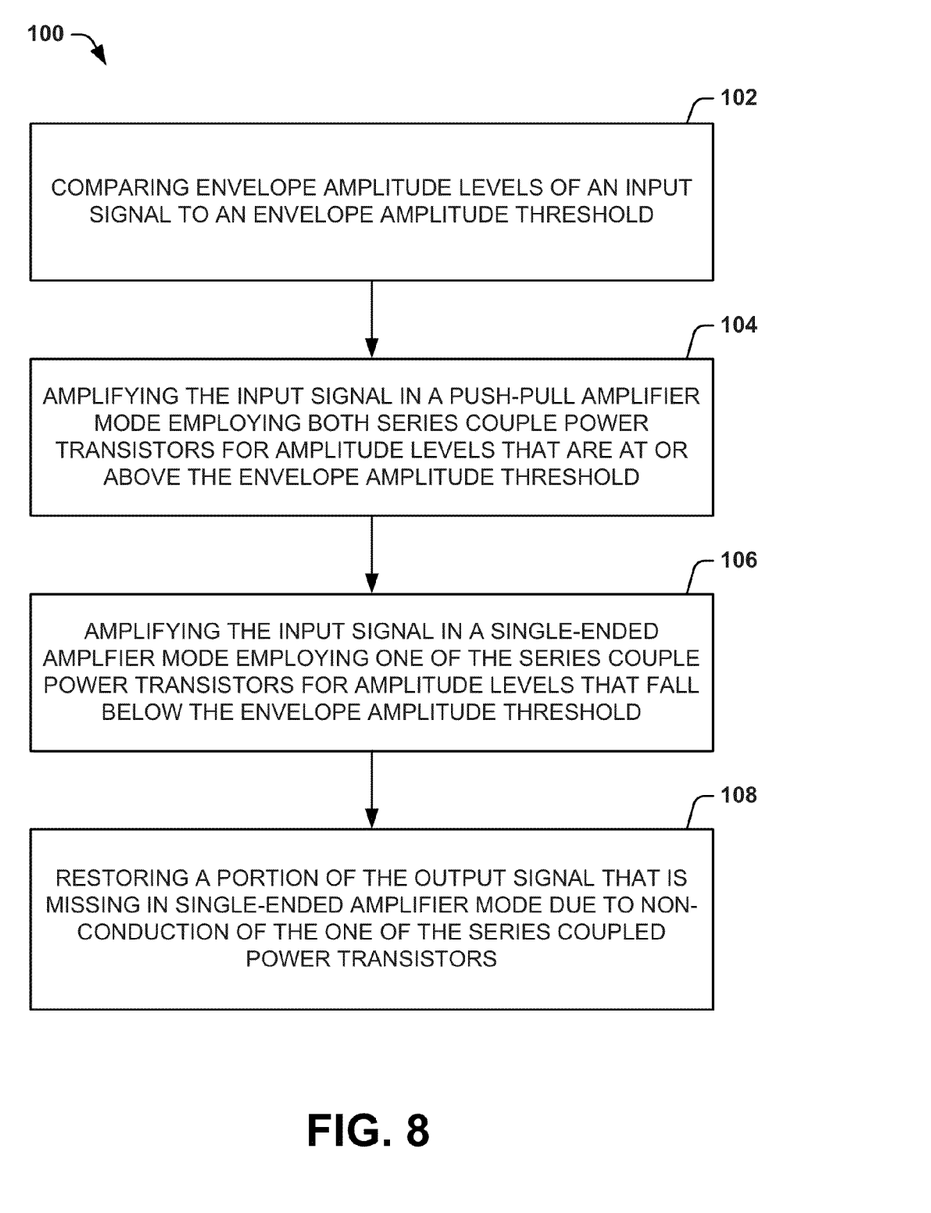
FIG. 8 illustrates an example of a method for amplifying an input signal in accordance with an aspect of the invention.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 8 illustrates an example of a method 100 for amplifying an input signal with increased efficiency employing a push-pull amplifier having a pair of series coupled power transistors. The method begins at 102 where envelope amplitude levels of an input signal are compared to an envelope amplitude threshold. At 104, the input signal is amplified in a push-pull amplifier mode employing both of the series coupled power transistors for envelope amplitude levels of the input signal that are at or above the envelope amplitude threshold. At 106, the input signal is amplified in a single-ended amplifier mode employing a selected one of the series coupled power transistors and the non-selected other of the series coupled power transistors is disabled for amplification purposes for envelope amplitude levels of the input signal that are below the envelope amplitude threshold. The non-selected other of the series coupled power transistors can be disable employing either extrinsic switching (e.g., FIG. 3,) or intrinsic switching (e.g., FIG. 4), or in response to the input signal (e.g., FIG. 5) which causes the impedance seen by the selected one of the series coupled power transistors to modulate between the system output load and twice the system output load. At 108, a portion of the output signal is restored that is missing in single-ended amplifier mode due to non-conduction of the non-selected one of the series coupled power transistors during one of the positive and negative portion of the input signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An amplification system comprising:
a push-pull amplifier system having a first power transistor series coupled with a second power transistor that alternately switch between a push-pull amplifier mode of operation in which both the first power transistor and the second power transistor alternately conduct to provide an amplified output signal to an output load in response to an input signal having an amplitude that is greater than or equal to a threshold level, and a single-ended amplifier mode of operation in which the first power transistor conducts and the second power transistor is disabled for amplification purposes in response to the input signal having an amplitude that is less than the threshold level.

2. The amplification system of claim 1, the threshold level being a positive envelope amplitude level.

3. The amplification system of claim 1, wherein the threshold level comprises a positive envelope amplitude threshold level and a negative envelope amplitude threshold level that define an envelope amplitude threshold window.

4. The amplification system of claim 1, wherein a mode selector controls one or more switches that can be set in a first state that configures the first and second power transistors in the push-pull amplifier mode and that can set the one or more switches in a second state that configures the first power transistor in single-ended amplifier mode of operation and disables the second power transistor for amplification purposes, the first power transistor drives double the output impedance in the single-ended amplifier mode than the output impedance that it drives in the push-pull amplifier mode.

5. The amplification system of claim 4, wherein the first power transistor receives a first input signal at its gate that is ½ of voltage of the input signal and the second power transistor receives a second input signal that is ½ of the voltage of the input signal and 180° out of phase with the first input signal, the first and second power transistor having drains coupled to a DC power supply and sources coupled to ground, the first and second power transistor alternately switching between providing a return path and pulling current from the DC power supply through an output transformer to provide an amplified output signal to the output load in response to the first and second input signals during the push-pull amplifier mode.

6. The amplification system of claim 5, wherein the one or more switches comprises a first switch coupled to a gate of the second power transistor.

7. The amplification system of claim 6, wherein the second end of the first switch is coupled to a DC voltage that sets the second power transistor in an off state when the first switch is closed and further comprising a second switch coupled to an opposite end of a primary of the transformer that a drain of the first power switch is coupled to pull current from the DC power supply through the output transformer and provide a return path through the second switch when the second switch is closed, the first and second switch being closed during the single-ended amplifier mode and open during the push-pull amplifier mode.

8. The amplification system of claim 6, wherein the second end of the first switch is coupled to a DC voltage that sets the second power transistor in an on state when the first switch is closed and further comprising a second switch coupled between a DC power supply and to a first impedance component that has a second end coupled to a drain of the second power transistor, such that the second power transistor pulls current from the DC power supply through the output transformer and provides a return path through the second power transistor when the second switch is closed, the first and second switch being closed during the single-ended amplifier mode and open during the push-pull amplifier mode and sequentially switched during transitions between the push-pull amplifier mode and single-ended amplifier mode to protect shorting of the DC power supply through the second power transistor.

9. The amplification system of claim 1, wherein the first and second power transistors are coupled to an output transformer and further comprising a matching network coupled between an output of the output transformer and the output load, the matching network restoring a portion of the output signal that is missing due to non-conduction of the second power transistor during the single-ended amplifier mode.

10. The amplification system of claim 1, wherein the second power transistor is biased below the threshold voltage of conduction of the second power transistor at a DC offset voltage, such that amplitudes of the input signal that are at or greater than the threshold level cause the second power transistor to conduct and amplitudes of the input signal below the threshold level cause the second power transistor not to conduct.

11. The amplification system of claim 10, further comprising a third transistor series coupled with the second power transistor for sinking current from the first power transistor during the single-ended amplifier mode, wherein the first power transistor is biased at a DC voltage that is above the threshold conduction voltage of the first power transistor during both the push-pull amplifier mode of operation and the single-ended amplifier mode of operation and the third transistor is biased at a DC voltage that is above the threshold conduction voltage of the third transistor for at least the single-ended amplifier mode of operation.

12. An amplification system comprising:
a first power transistor series coupled with a second power transistor wherein the first power transistor receives a first input signal at its gate that is ½ of the voltage of an input signal received from a first end of a secondary winding of an input transformer and a second power transistor that receives a second input signal that is ½ of the voltage of the input signal and 180° out of phase with the first input signal received from a second end of the secondary winding of the input transformer;
the amplification system having a first state with the first and second power transistors alternately switching between providing a return path and pulling current from a DC power supply to provide an amplified output signal to an output load in response to the first and second input signals during a push-pull amplifier mode of operation; and
the amplification system having a second state that employs the first power transistor in single-ended amplifier mode of operation in response to the first input signal and disables the second power transistor for amplification purposes, the first power transistor drives double the output impedance in the single-ended amplifier mode than the output impedance it drives in the push-pull amplifier mode.

13. The amplification system of claim 12, further comprising a mode selector that sets one or more switches to put the amplifier system in the first state when envelope amplitude level of the input signal fall outside an envelope amplitude threshold window and sets switches to put the amplifier system in the second state when the envelope amplitude level of the input signal falls within the envelope amplitude threshold window.

14. The system of claim 13, wherein the one or more switches comprises a first switch having a first end coupled to a gate of the second power transistor.

15. The system of claim 14, wherein the second end of the first switch is coupled to a DC voltage that sets the second power transistor in an off state when the first switch is closed and further comprising a second switch coupled to an end of a primary of an output transformer and a drain of the second power switch to pull current from the DC power supply through the output transformer and provide a return path when the second switch is closed, the first and second switch being closed during single-ended amplifier mode and open during push-pull amplifier mode.

16. The system of claim 14, wherein the second end of the first switch is coupled to a DC voltage that sets the second power transistor in an on state when the first switch is closed and further comprising a second switch coupled between the DC power supply and to a first impedance component that has a second end coupled to a drain of the second power transistor, such that the second power transistor pulls current from the DC power supply through the output transformer and provides a return path through the second power transistor when the second switch is closed, the first and second switch being closed during the single-ended amplifier mode and open during the push-pull amplifier mode and sequentially switched during transitions between the push-pull amplifier mode and the single-ended amplifier mode to protect shorting of the DC power supply through the second power transistor.

17. The system of claim 12, further comprising a matching network coupled between an output of an output transformer and the output load, the matching network restoring a portion of the output signal that is missing due to non-conduction of the second power transistor during one of a positive portion and a negative portion of the input signal during the single-ended amplifier mode.

18. The amplification system of claim 12, wherein the second power transistor is biased below the threshold voltage of conduction of the second power transistor at a DC offset voltage to bias the second power transistor in a class C configuration, such that amplitudes of the second input signal that are at or greater than the threshold level cause the second power transistor to conduct and amplitudes of the second input signal below the threshold level cause the second power transistor not to conduct.

19. The amplification system of claim 18, further comprising a third transistor series coupled with the second power transistor for sinking current from the first power transistor during the single-ended amplifier mode, wherein the first power transistor and the third transistor are biased in a class AB configuration.

20. A method of amplifying an input signal with increased efficiency employing a push-pull amplifier having a pair of series coupled power transistors, the method comprising:
comparing envelope amplitude levels of an input signal to an envelope amplitude threshold;
amplifying the input signal in a push-pull amplifier mode employing both of the series coupled power transistors for envelope amplitude levels of the input signal that fall at or above the envelope amplitude threshold; and
amplifying the input signal in a single-ended amplifier mode employing one of the series coupled power transistors and disabling the other of the series coupled power transistors for amplification purposes for envelope amplitude levels of the input signal that fall below the envelope amplitude threshold.

21. The method of claim 20, wherein disabling the other of the series coupled power transistors for amplification purposes comprises:
biasing the other of the series coupled power transistor in an off state; and
switching in an extrinsic return path for pulling current from a DC power supply coupled to the one of the series coupled power transistors.

22. The method of claim 20, wherein disabling the other of the series coupled power transistors for amplification purposes comprises:
disconnecting DC power from the other of the series coupled power transistors; and
biasing the other of the series coupled power transistors in an on state to provide an intrinsic return path through the other of the series coupled power transistors for pulling current from a DC power supply coupled to the one of the series coupled power transistors.

23. The method of claim 22, further comprising enabling the other of the series coupled power transistors for amplification purposes comprising:
removing biasing to the other of the series coupled power transistors to disengage a forced on state of the other of the series coupled power transistors; and
reconnecting DC power to the other of the series coupled power transistors.

24. The method of claim 20, further comprising:
series coupling a third transistor to the other of the series coupled power transistors for sinking current from the one of the power transistors during the single-ended amplifier mode; and
biasing the other of the series coupled power transistors below its threshold voltage of conduction, such that amplitudes of the input signal that are at or greater than the threshold level cause it to conduct and amplitudes of the input signal below the threshold level cause it not to conduct.

25. The method of claim 20, wherein soft switching is employed to transition between the single-ended amplification mode and the push-pull amplification mode.

\* \* \* \* \*